US008053973B2

(12) United States Patent
Nagayama et al.

(10) Patent No.: US 8,053,973 B2
(45) Date of Patent: Nov. 8, 2011

(54) FILM FORMING COMPOSITION AND ORGANIC ELECTROLUMINESCENT DEVICE

(75) Inventors: Kenichi Nagayama, Saitama (JP); Tomoyuki Ogata, Kanagawa (JP); Koichiro Iida, Kanagawa (JP)

(73) Assignees: Pioneer Corporation, Tokyo (JP); Mitsubishi Chemical Corporation, Tokyo (JP)

( * ) Notice: Subject to any disclaimer, the term of this patent is extended or adjusted under 35 U.S.C. 154(b) by 843 days.

(21) Appl. No.: 11/815,669

(22) PCT Filed: Feb. 8, 2006

(86) PCT No.: PCT/JP2006/302118
§ 371 (c)(1),
(2), (4) Date: Aug. 7, 2007

(87) PCT Pub. No.: WO2006/087945
PCT Pub. Date: Aug. 24, 2006

(65) Prior Publication Data
US 2009/0033208 A1    Feb. 5, 2009

(30) Foreign Application Priority Data

Feb. 15, 2005    (JP) ................................. 2005-037902

(51) Int. Cl.
*H01B 1/12*    (2006.01)
*H01J 1/62*    (2006.01)
(52) U.S. Cl. .................................. 313/504; 252/519.34
(58) Field of Classification Search .................. 428/690, 428/917, 411.1, 336; 313/502–509; 257/40, 257/88, 104, E51, 1; 427/58, 66, 519.34
See application file for complete search history.

(56) References Cited

U.S. PATENT DOCUMENTS

| 2002/0033910 A1 | 3/2002 | Ohnishi et al. |
| 2002/0197392 A1 | 12/2002 | Endo et al. |
| 2003/0006411 A1 | 1/2003 | Kido et al. |
| 2004/0004433 A1 | 1/2004 | Lamansky et al. |
| 2004/0195551 A1 | 10/2004 | Endo et al. |
| 2006/0182993 A1 | 8/2006 | Ogata et al. |

FOREIGN PATENT DOCUMENTS

| EP | 0 982 974 A1 | 3/2000 |
| EP | 1 372 195 A2 | 12/2003 |
| EP | 1 725 079 A1 | 11/2006 |

(Continued)

OTHER PUBLICATIONS

Machine English translation JP 09188756 A. Dec. 2, 2009.*

(Continued)

*Primary Examiner* — Angela Ortiz
*Assistant Examiner* — Jack L. Yang
(74) *Attorney, Agent, or Firm* — Oblon, Spivak, McClelland, Maier & Neustadt, L.L.P.

(57) ABSTRACT

A film-forming composition that attains an improvement in the solubility of a hole-injecting/transporting material and/or an electron-accepting compound and has a drying rate appropriate for stable formation of a uniform coating film, being suitable for the formation of a hole-injecting/transporting layer. This composition comprises a hole-injecting/transporting material and/or an electron-accepting compound and a liquid in which the hole-injecting/transporting material and/or the electron-accepting compound are dissolved. This liquid mainly contains a solvent whose molecule has an aromatic ring and/or an aliphatic ring and an oxygen atom and which has either a boiling point of at least 200° C. or a vapor pressure of 1 torr or lower at 25° C.

26 Claims, 4 Drawing Sheets

FOREIGN PATENT DOCUMENTS

| | | |
|---|---|---|
| JP | 9-188756 | 7/1997 |
| JP | 9 188756 | 7/1997 |
| JP | 09188756 A * | 7/1997 |
| JP | 11-283750 | 10/1999 |
| JP | 11 283750 | 10/1999 |
| JP | 2000 36390 | 2/2000 |
| JP | 2000-36390 | 2/2000 |
| JP | 2000 106278 | 4/2000 |
| JP | 2001 329259 | 11/2001 |
| JP | 2001329259 A * | 11/2001 |
| JP | 2001-342364 | 12/2001 |
| JP | 2001 342364 | 12/2001 |
| JP | 2002 56985 | 2/2002 |
| JP | 2002-56985 | 2/2002 |
| JP | 2002 371196 | 12/2002 |
| JP | 2003 31365 | 1/2003 |
| JP | 2003031365 A * | 1/2003 |
| JP | 2004-119351 | 4/2004 |
| JP | 2004 119351 | 4/2004 |
| JP | 2004 134213 | 4/2004 |
| JP | 2004-134213 | 4/2004 |
| JP | 2004134213 A * | 4/2004 |
| JP | 2004-179144 | 6/2004 |
| JP | 2004-204114 | 7/2004 |
| JP | 2004 204114 | 7/2004 |
| JP | 2004-362930 | 12/2004 |
| JP | 2004 362930 | 12/2004 |
| JP | 2005-93427 | 4/2005 |
| JP | 2005-93428 | 4/2005 |
| JP | 2005 089024 | 9/2005 |
| WO | WO 03/069959 A1 | 8/2003 |

OTHER PUBLICATIONS

Machine English translation JP 2001329259 A. Dec. 2, 2009.*
Machine English translation JP 2003031365 A. Dec. 2, 2009.*
Machine English translation JP 2004134213 A. Dec. 2, 2009.*
U.S. Appl. No. 12/500,872, filed Jul. 10, 2009, Ogata, et al.

* cited by examiner

FILM FORMING COMPOSITION AND ORGANIC ELECTROLUMINESCENT DEVICE

TECHNICAL FIELD

The present invention relates to a film-forming composition that is used for the formation of a hole-injecting/transporting layer of an organic electroluminescent device, and an organic electroluminescent device wherein the hole-injecting/transporting layer is formed of the film-forming composition.

BACKGROUND ART

In Patent Documents 1 to 3 below, wet film-forming methods used to produce a hole-injecting layer of an organic electroluminescent device are described.

Patent Document 1 discloses a method used to form a hole-injecting/transporting layer by a spin-coating technique wherein a solution containing a hole-transporting material, polyether with aromatic diamine, and an electron-accepting compound, tris(4-bromophenyl)ammonium hexachloroantimonate (TBPAH), in dichloromethane is used.

Patent Document 2 discloses a method used to form a hole-injecting layer by a spin-coating technique, wherein a solution containing polyether with aromatic diamine in 1,2-dichloroethane is used.

Patent Document 3 discloses a method used to form a hole-injecting layer by a spin-coating technique, wherein a solution containing a mixture of 4,4'-bis[N-(m-tolyl)-N-phenylamino]biphenyl and an electron-accepting compound, antimony pentachloride, in 1,2-dichloroethane is used.

In Patent Documents 4 and 5 below, compositions for forming a hole-injecting/transporting layer by an inkjet technique are described.

Patent Document 4 discloses a coating liquid prepared by dispersing copper phthalocyanine or a conductive polymer, polyethylenedioxythiophene (PEDT), and polystyrene sulfonate (PSS) in a mixed solvent of water, lower alcohol and other components.

In Patent Document 5, a coating liquid prepared by dispersing PEDT and PSS in a solvent composed of water, ethanol and dipropylene glycol is disclosed.

Patent Document 1: Japanese Unexamined Patent Application Publication No. H11-283750
Patent Document 2: Japanese Unexamined Patent Application Publication No. 2000-36390
Patent Document 3: Japanese Unexamined Patent Application Publication No. 2002-56985
Patent Document 4: Japanese Unexamined Patent Application Publication No. 2000-106278
Patent Document 5: Japanese Unexamined Patent Application Publication No. 2004-204114

Compositions for the formation of a hole-injecting/transporting layer that are used in known wet film-forming methods often contain water as solvent. In general, the presence of water would impair the properties of an organic electroluminescent device. Therefore, as much water as possible must be removed from the formed layer when such a water-containing composition is used. It is difficult to eliminate water from the formed hole-injecting/transporting layer. Existing organic electroluminescent devices have deteriorated properties due to the moisture remaining inside the layer. In manufacturing of the organic electroluminescent devices, fluctuations in the remaining moisture amounts among individual organic electroluminescent devices that occur during the film-forming step results in the devices having inconsistent properties.

Most film-forming materials used for producing a hole-injecting layer or a hole-transporting layer of an organic electroluminescent device, such as 4,4'-bis[N-(m-tolyl)-N-phenylamino]biphenyl and polyether with aromatic diamine, have low solubility in commonly used solvents, thus making it difficult to prepare a solution of an appropriate concentration when producing a thin layer of organic material by a wet film-forming method.

To form a highly uniform hole-injecting/transporting layer, it is important that the layer has a high affinity for the substrate. Accordingly, a solvent used to prepare a solution used in a wet film-forming method is required to have not only a capability of dissolution of a hole-injecting/transporting material but also a high affinity for the substrate. However, it has been difficult to prepare a solution that satisfies both these requirements evenly.

When producing an organic electroluminescent device, wherein two or more layers are laminated, by an inkjet film-forming technique, a drying rate of the coating liquid is significantly important for controlling the efficiency of manufacturing processes. For example, the use of a solvent with a higher vapor pressure causes the solvent to evaporate during spraying of the coating liquid from a spray nozzle onto a surface to be coated and clogging in the nozzle to occur, thus making it difficult to form a highly uniform organic layer.

DISCLOSURE OF INVENTION

An object of the present invention is to provide a water-free film-forming composition, which is used to form a hole-injecting layer or a hole-transporting layer of an organic electroluminescent device. The present invention also aims at providing a film-forming composition that attains one, preferably all, of the improvements in the solubility of a hole-injecting/transporting material, stability during discharge from a spray nozzle, affinity between a formed coating film and a substrate layer, and appropriateness of drying rate for the formation of a uniform coating layer.

Furthermore, the present invention intends to provide an organic electroluminescent device wherein the hole-injecting/transporting layer is formed of such a film-forming composition.

The film-forming composition according to the present invention is a composition used to form a hole-injecting/transporting layer of an organic electroluminescent device, wherein the film-forming composition contains a hole-injecting/transporting material and/or an electron-accepting compound and a liquid in which the material and/or the compound are dissolved; the liquid contains a solvent whose molecule has an aromatic ring and/or an aliphatic ring and an oxygen atom and which has either a boiling point of at least 200° C. or a vapor pressure of 1 torr or lower at 25° C. (hereinafter, referred to as "first solvent"); and the amount of the first solvent contained in the composition is 3 wt % or more.

The organic electroluminescent device according to the present invention is characterized in that its hole-injecting/transporting layers are formed of such a film-forming composition.

BRIEF DESCRIPTION OF THE DRAWINGS

[FIG. 1]

[FIG. 2]

BEST MODE FOR CARRYING OUT THE INVENTION

Figure 1A:
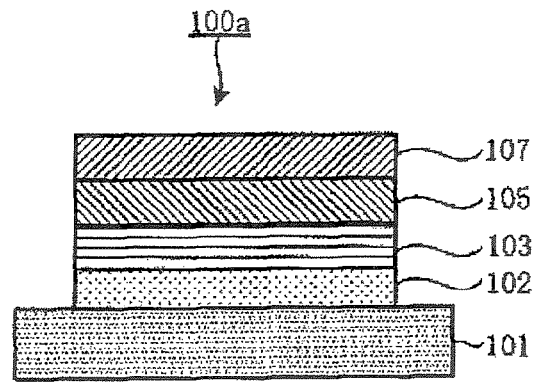
FIGS. 1a, 1b and 1c are sectional views that illustrate an example configuration of an organic electroluminescent device with thin layers formed of the film-forming composition according to the embodiment.

By employing the present invention, a film-forming composition that attains an improvement in the solubility of a hole-injecting/transporting material and/or an electron-accepting compound, has a drying rate appropriate for stable formation of a uniform coating film, and is suitable for the formation of a hole-injecting/transporting layer is obtained.

A solvent containing a compound whose molecule has an aromatic ring and/or an aliphatic ring and an oxygen atom shows high solubility of a hole-injecting/transporting material such as aromatic amine and an electron-accepting compound such as aromatic boron compounds, so that the concentration of the hole-injecting/transporting material and/or the electron-accepting compound in the composition is increased. Therefore, such a solvent enables to prepare a composition with an optimal concentration or viscosity. The first solvent has a boiling point of at least 200° C. or a vapor pressure 1 torr (133 Pa) or lower at 25° C., thus being extremely hard to evaporate. Consequently, the use of the first solvent in applications using an inkjet method or a spraying method can prevent clogging in the spray head nozzle caused by the solvent evaporation. Also, evaporation of the first solvent from the coating film is reduced, so that the self-leveling property of the coating film leads to the formation of a film without any unevenness in thickness.

Thus the film-forming composition according to the present invention is suitable for the formation of a hole-injecting/transporting layer using an inkjet method or a spraying method due to its resistance to dryness and excellent leveling property.

When the liquid contained in the film-forming composition of the present invention does not include water, the device obtained thereby acquires consistent properties and an improved hole-transporting performance.

The inventors found that, to form a uniform film by using an inkjet method, it is preferable to use a mixture of a solvent with a lower boiling point or a higher vapor pressure and another solvent with a higher boiling point or a lower vapor pressure in an appropriate ratio.

In a mode of the present invention, the liquid comprises the first solvent and the second solvent, which has an aromatic ring and/or an aliphatic ring and an oxygen atom in its molecule but is not classified into the same type as the first solvent, and the weight ratio between the second and first solvents $W_2/W_1$, where $W_2$ is the weight proportion of the second solvent and $W_1$ the weight proportion of the first solvent, is 1 to 20. To obtain even films, $W_2/W_1$ of 1 to 2.5 is especially preferable.

In another mode of the present invention, the liquid comprises aromatic ester (weight proportion $W_a$) as the first solvent and a low-evaporability solvent (weight proportion $W_b$) that is classified into the same type as the first solvent and has a higher boiling point or a lower vapor pressure at 25° C. when compared with the aromatic ester, and the weight ratio $W_a/W_b$ is 1 to 20. To improve evenness of obtained films, $W_a/W_b$ of 1 to 2.5 is especially preferable. In this case, it is advisable to use benzoate as the aromatic ester and acetate having an aromatic ring as the low-evaporability solvent.

In the present invention, a liquid that substantially consists of the first solvent only may be used. This can reduce evaporation of the solvent from the composition during the formation of a film.

In the film-forming composition according to the present invention, the hole-injecting/transporting material may be aromatic amine, and the electron-accepting compound may be an aromatic boron compound and/or its salt.

An organic electroluminescent device is formed by laminating many layers of organic compounds, and thus each of the layers should be uniform. In the layer formation using a wet film-forming method, moisture entrained in film-forming compositions may lead to decreased evenness of the film due to the presence of moisture in the coating film. Therefore, it is advisable to reduce the moisture content in the film-forming composition of the present invention as much as possible.

The moisture content of the film-forming composition of the present invention is preferably not more than 1 wt % because an organic electroluminescent device incorporates a lot of materials that are significantly damaged by water (e.g., aluminum constituting a cathode). This improves uniformity of the film and prevents the organic electroluminescent device, particularly the cathode, from deteriorating.

The film-forming composition of the present invention is suitable for use as a coating liquid to produce at least one of a hole-injecting layer and a hole-transporting layer.

A film formed of the film-forming composition according to the present invention has excellent uniformity. This film may be a hole-injecting/transporting layer formed onto a certain area of the substrate surface where unevenness due to the presence of patterned electrodes or walls between imaging elements has been left.

The best mode for carrying out the present invention is explained in more detail below.

The film-forming composition of the present invention is suitable for use as a coating liquid to produce a hole-injecting layer and/or a hole-transporting layer between an anode and a luminescent layer.

In this description, if there is one layer between the anode and the luminescent layer, the layer is referred to as "hole-injecting layer," and if there are two or more layers, the layer next to the anode is referred to as "hole-injecting layer" and other layers are collectively referred to as "hole-transporting layer." In some contexts, layers between the anode and the luminescent layer are collectively called "hole-injecting/transporting layer."

[Liquid in the Film-Forming Composition]

The film-forming composition of the present invention contains a hole-injecting/transporting material and/or an electron-accepting compound that forms at least one of a hole-injecting layer and a hole-transporting layer of an organic electroluminescent device, in addition to a liquid in which the hole-injecting/transporting material and/or the electron-accepting compound are dissolved.

The liquid has an aromatic ring and/or an aliphatic ring and an oxygen atom in its molecules and contains a first solvent, which has a boiling point of at least 200° C. or a vapor pressure of 1 torr or lower at 25° C. The aromatic ring may be any of an aromatic hydrocarbon ring and an aromatic heterocyclic ring but preferably is an aromatic hydrocarbon ring.

The concentration of the first solvent contained in the film-forming composition is typically at least 3 wt %, preferably at least 10 wt %, more preferably at least 50 wt %, and most preferably at least 80 wt %. It is advisable that 50 wt % or more of the liquid contained in the composition is a first solvent. A liquid that substantially consists of a first solvent only may be contained in the composition.

Requirements for the first solvent are only a boiling point of at least 200° C. and a vapor pressure of 1 torr or lower at 25° C., and there is no specific requirement of the upper limit of the boiling point or the lower limit of the vapor pressure. Ranges of preferred boiling points and vapor pressures may vary depending on the ratio of the first solvent to the entire solvent, the nature of other solvents simultaneously used or other factors, and thus there is no standard of them. However, in general, a suitable boiling point of the first solvent is approximately 200 to 300° C. and a suitable vapor pressure at 25° C. is approximately 0.001 to 1 torr.

Examples of the first solvent include methyl benzoate, ethyl benzoate, isopropyl benzoate, propyl benzoate, n-butyl benzoate, dimethyl phthalate, 2-phenoxyethyl acetate, phenyl propionate and other aromatic esters.

The liquid may contain two or more kinds of first solvent. In this case, the liquid may contain a first solvent with lower evaporability and another first solvent with higher evaporability.

The liquid may contain at least one kind of first solvents and at least one kind of second solvents, which have an aromatic ring and/or an aliphatic ring and an oxygen atom in their molecule but are not classified into the same type as the first solvent.

Examples of the second solvent include:

aromatic esters that are not classified into the same type as the first solvent, such as phenyl acetate and ethyl(pentafluorobenzoate);

aromatic ethers such as anisole and phenetole;

alicyclic ketones such as cyclohexanone, methylcyclohexanone, cyclopentanone, cycloheptanone, and cyclooctanone; and alicyclic alcohols such as cyclohexanol, methylcyclohexanol, cyclopentanol, cycloheptanol, and cyclooctanol.

A second solvent has a boiling point lower than 200° C. and a vapor pressure higher than 1 torr at 25° C. The second solvent preferably has a boiling point of 150° C. or higher and a vapor pressure of 5 torr or lower at 25° C. It is preferable that the hole-injecting/transporting material and/or the electron-accepting compound are dissolved well in the second solvent, and the solubility may be larger than that of first solvent.

As described above, the liquid may contain at least one kind of first solvents and at least one kind of second solvents.

In this case, the ratio $W_2/W_1$, where $W_2$ is the weight proportion of the second solvent relative to the entire liquid and $W_1$ the weight proportion of the first solvent, is 1 to 20 and preferably 1 to 19. If the amount of the first solvent is so low as to deviate from these ranges, the present invention may provide insufficient effects, while if the amount is too high, the use of the second solvent other than the first solvent may not have the sufficient effect of adjusting the drying rate. The ratio $W_2/W_1$ may be 3 to 19.

To achieve better evenness of the film, $W_2/W_1$ is preferably 1 to 2.5.

In the present invention, as described above, the liquid may contain two or more kinds of first solvents. For example, a first solvent with higher evaporability and another first solvent with lower evaporability may be contained therein. More specifically, a high-evaporability first solvent having a boiling point of 200 to 240° C. or a vapor pressure of 1 to 0.1 torr at 25° C. may be mixed with a low-evaporability first solvent having a boiling point of at least 250° C. or a vapor pressure of 0.1 torr or lower at 25° C. for use. In this case, the ratio $W_a/W_b$, where $W_a$ is the weight proportion of the high-evaporability first solvent relative to the entire composition and $W_b$ the weight proportion of the low-evaporability first solvent, is preferably 1 to 20, and more preferably 1 to 19.

To achieve better evenness of the film, $W_a/W_b$ is more preferably 1 to 2.5.

A preferred first solvent with higher evaporability is benzoate, such as ethyl benzoate. A preferred first solvent with lower evaporability is acetate that has an aromatic ring, such as 2-phenoxyethyl acetate. A film formed by applying a liquid that contains ethyl benzoate and 2-phenoxyethyl acetate would be excellent in terms of evenness.

The difference in boiling points between the high-evaporability and low-evaporability first solvent is preferably 20° C. or more, and more preferably 40 to 100° C., while the difference in vapor pressures at 25° C. is preferably 0.09 torr or more, and more preferably 0.2 to 0.999 torr.

The solubility of the hole-injecting/transporting material and/or the electron-accepting compound in the high-evaporability first solvent may be greater than that in the low-evaporability first solvent.

The liquid may contain three or more kinds of first solvents. For example, the liquid may contain three or more kinds of first solvents with different evaporability. In this case, $W_H/W_L$, where $W_H$ is the weight proportion of the first solvent with the highest evaporability and $W_L$ the weight proportion of the first solvent with the lowest evaporability, is preferably 1 to 20 and more preferably 1 to 19, and may be 1 to 2.5.

The liquid may further contain one or more kinds of other solvents, for example, one or more kinds of aromatic hydrocarbons such as benzene, toluene and xylene; one or more kinds of amides such as N,N-dimethylformamide and N,N-dimethylacetamide; and dimethylsulfoxides.

It should be noted that, as described above, the liquid preferably contains 50 wt % or more of the first solvent and may substantially consist of the first solvent only.

[Hole-Injecting/Transporting Material]

Examples of hole-injecting/transporting materials include aromatic amines, phthalocyanine derivatives, porphyrin derivatives, metal complexes of 8-hydroxyquinoline derivatives having a diarylamino group, and oligothiophene derivatives. Polymeric compounds that have intramolecular hole-transporting sites may also be used. These hole-injecting/transporting materials may be used separately or in combination of two or more kinds.

Examples of polymeric compounds that have intramolecular hole-transporting sites include polymeric aromatic amines that contain tertiary aromatic amino groups as a constitutional unit of the backbone. More specific examples include hole-injecting/transporting materials having the structure shown in Formula (I) below as a repeating unit.

[Chemical Formula 1]

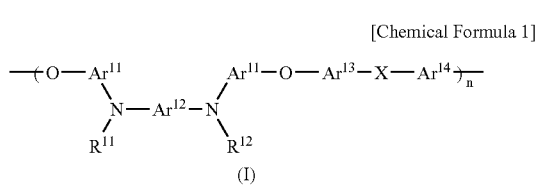

(I)

In Formula (I), the groups $Ar^{11}$ to $Ar^{14}$ represent divalent aromatic ring groups, each of which may have a substituent independently chosen, and the groups $R^{11}$ and $R^{12}$ represent monovalent aromatic ring groups, each of which may have a substituent independently chosen. X represents a direct bond or a binding group selected from the following groups.

[Chemical Formula 2]

"Aromatic ring groups" include both "groups derived from aromatic hydrocarbon rings" and "groups derived from aromatic heterocyclic groups."

In Formula (I) above, the groups $A^{11}$ to $A^{14}$ are preferably divalent benzene rings, naphthalene rings, anthracene rings, or groups derived from biphenyl, and more preferably groups derived from benzene rings, each of which may have a substituent independently chosen Examples of the substituents include halogen atoms; linear or branched alkyl chains with one to six carbons such as methyl groups and ethyl groups; alkenyl groups such as vinyl groups; linear or branched alkoxycarbonyl groups with two to seven carbons methoxycarbonyl groups and ethoxycarbonyl groups; linear or branched alkoxy groups with one to six carbons such as methoxy groups and ethoxy groups; aryloxy groups with six to twelve carbons such as phenoxy groups and benzyloxy groups; and dialkylamino groups that contains alkyl chains with one to six carbons such as diethylamino groups and diisopropylamino groups. Among these examples, alkyl groups with one to three carbons are preferable, and methyl groups are more preferable. In the most preferred case, however, all of the groups $A^{11}$ to $A^{14}$ are aromatic ring groups without any substitution.

Examples of the groups $R^{11}$ and $R^{12}$ are preferably phenyl, naphthyl, anthryl, pyridyl, triazyl, pyrazyl, quinoxalyl, thienyl or biphenyl groups; more preferably phenyl, naphthyl or biphenyl groups; and most preferably phenyl groups, each of which may have a substituent independently chosen. Examples of the substituents include the same groups as those described as possible substituents for aromatic ring groups of $Ar^{11}$ to $Ar^{14}$.

Compounds that have the structure shown in Formula (I) as a repeating unit can be synthesized via some routes including the route disclosed in the method of Kido et al. (Polymers for Advanced Technologies, Vol. 7, Page 31, 1996; Japanese Unexamined Patent Application Publication No. H9-188756).

Preferred examples of the structure shown in Formula (I) are presented in, but not limited to, the following formulae.

[Chemical Formula 3]

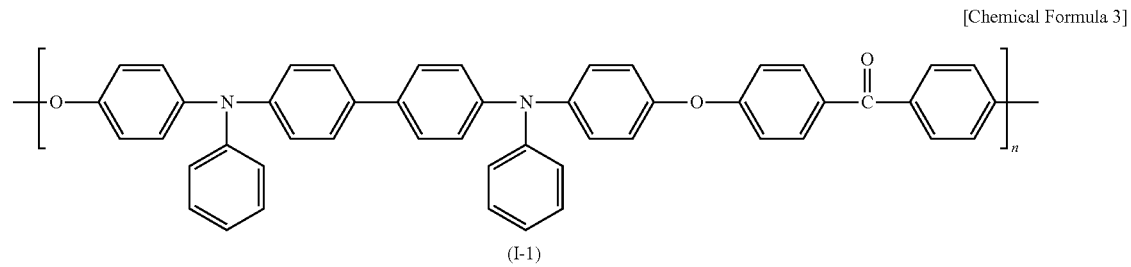

(I-1)

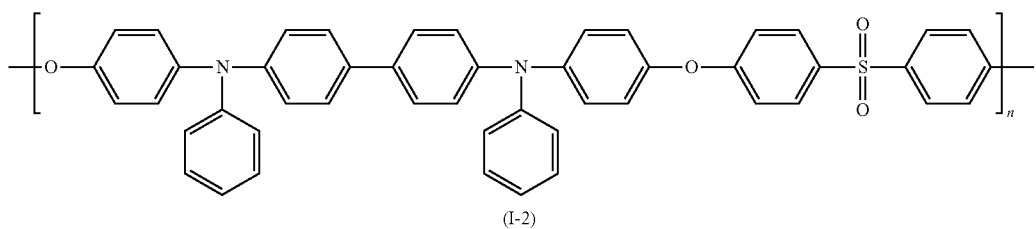

(I-2)

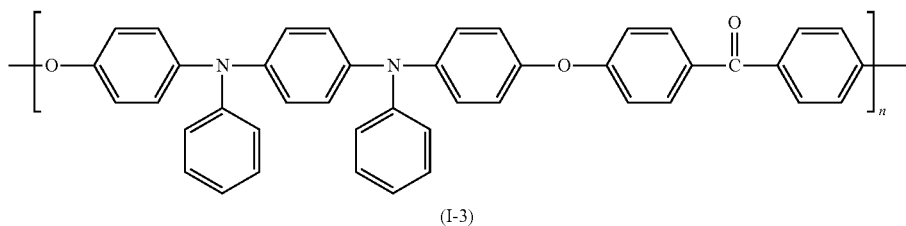

(I-3)

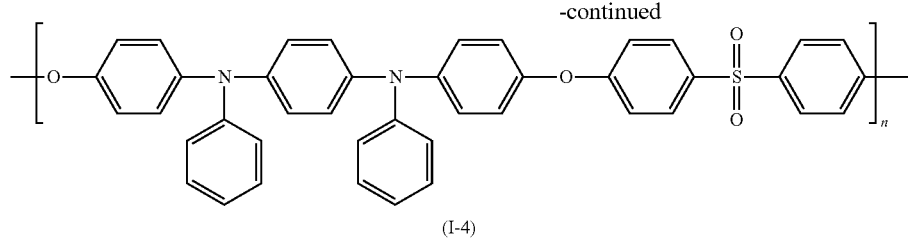

(I-4)

Though a hole-injecting/transporting material formed of a polymeric compound that has intramolecular hole-transporting sites is most preferably homopolymer with the structure shown in Formula (I), it is allowed that the material is copolymer containing any kinds of monomers with other structures. If the material is copolymer, it preferably contains at least 50 mol % of constitutional units shown in Formula (I), and more preferably, it contains at least 70 mol % of the constitutional units.

In addition, a hole-injecting/transporting material formed of a polymeric compound may contain two or more kinds of structures shown in Formula (I) in one species. Furthermore, it is permissible to use two or more kinds of compounds containing the structure illustrated in Formula (I) in combination with each other.

Examples of the hole-injecting/transporting material formed of a polymeric compound further include conjugated polymers, which are preferably polyfluorene, polypyrrole, polyaniline, polythiophene, or polyparaphenylene vinylene.

In addition, aromatic amines to form a hole-injecting/transporting material include triarylamine-structured compounds, or can be selected from existing compounds for the formation of hole-injecting/transporting layers of organic electroluminescent devices.

Besides the compounds with the structure shown in Formula (I) above, some known compounds can be used as the hole-injecting/transporting material. Examples of such known compounds include aromatic diamines combined with tertiary aromatic amine units, such as 1,1-bis(4-di-p-tolylaminophenyl)cyclohexane (Japanese Unexamined Patent Application Publication No. S59-194393); aromatic amines, wherein two or more tertiary amino groups are present and two or more condensed aromatic rings have been substituted by nitrogen atoms, represented by 4,4'-bis[N-(1-naphthyl)-N-phenylamino]biphenyl (Japanese Unexamined Patent Application Publication No. H5-234681); aromatic triamines that are derived from triphenylbenzenes and have a starburst structure (U.S. Pat. No. 4,923,774); aromatic diamines such as N,N'-diphenyl-N,N'-bis(3-methylphenyl)biphenyl-4,4'-diamine (U.S. Pat. No. 4,764,625); α,α,α',α'-tetramethyl-α,α'-bis(4-di-p-tolylaminophenyl)-p-xylene (Japanese Unexamined Patent Application Publication No. H3-269084); triphenylamine derivatives wherein each entire molecule has an asymmetric stereostructure (Japanese Unexamined Patent Application Publication No. H4-129271); compounds wherein two or more pyrenyl groups have been substituted by aromatic diamino groups (Japanese Unexamined Patent Application Publication No. H4-175395); aromatic diamines connected to tertiary aromatic amine units via ethylene groups (Japanese Unexamined Patent Application Publication No. H4-264189); aromatic diamines having a styryl structure (Japanese Unexamined Patent Application Publication No. H4-290851); substances formed by combining tertiary aromatic amine units via thiophene groups (Japanese Unexamined Patent Application Publication No. H4-304466); starburst-structured aromatic triamines (Japanese Unexamined Patent Application Publication No. H4-308688); benzylphenyl compounds (Japanese Unexamined Patent Application Publication No. H4-364153); substances formed by combining tertiary amines via fluorene groups (Japanese Unexamined Patent Application Publication No. H5-25473); triamine compounds (Japanese Unexamined Patent Application Publication No. H5-239455); bis-dipyridylaminobiphenyls (Japanese Unexamined Patent Application Publication No. H5-320634); N,N,N-triphenylamine derivatives (Japanese Unexamined Patent Application Publication No. H6-1972); aromatic diamines having a phenoxazine structure (Japanese Unexamined Patent Application Publication No. H7-138562); diaminophenylphenanthridine derivatives (Japanese Unexamined Patent Application Publication No. H7-252474); hydrazone compounds (Japanese Unexamined Patent Application Publication No. H2-311591); silazane compounds (U.S. Pat. No. 4,950,950); silanamine derivatives (Japanese Unexamined Patent Application Publication No. H6-49079); phosphamine derivatives (Japanese Unexamined Patent Application Publication No. H6-25659); and quinacridone compounds.

These compounds may be used separately or in combination of two or more kinds.

The amount of the hole-injecting/transporting material contained in the film-forming composition of the present invention is typically 0.05 wt % or more, and preferably 1 wt % or more. At the same time, it is typically 50 wt % or less, and preferably 30 wt % or less.

[Electron-Accepting Compound]

Examples of electron-accepting compounds contained in the film-forming composition according to this embodiment include one or more kinds of compounds selected from the group consisting of aromatic boron compounds and their salts, metal halides, Lewis acids, organic acids, salts formed of aromatic amines and metal halides, and salts formed of aromatic amines and Lewis acids. These electron-accepting compounds are mixed with the hole-injecting/transporting material for use, thus improving conductivity of the hole-injecting layer by oxidization of the hole-injecting/transporting material.

Preferred specific examples of the aromatic boron compounds and their salts are as follows, but not limited to those described.

[Chemical Formula 4]
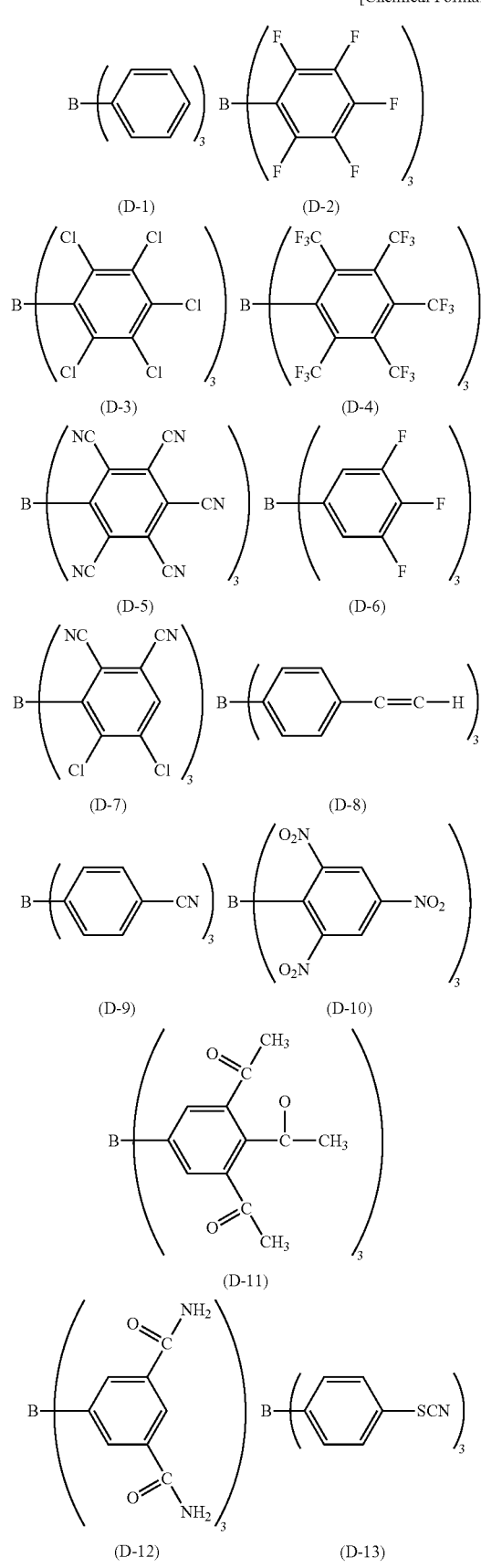
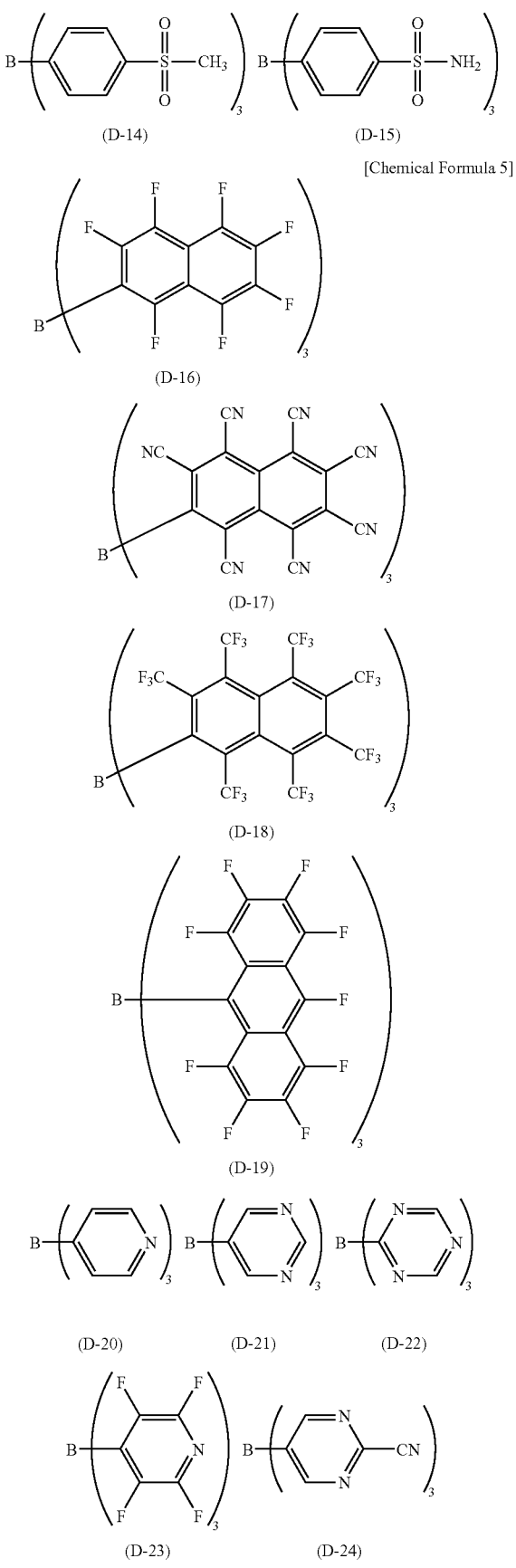

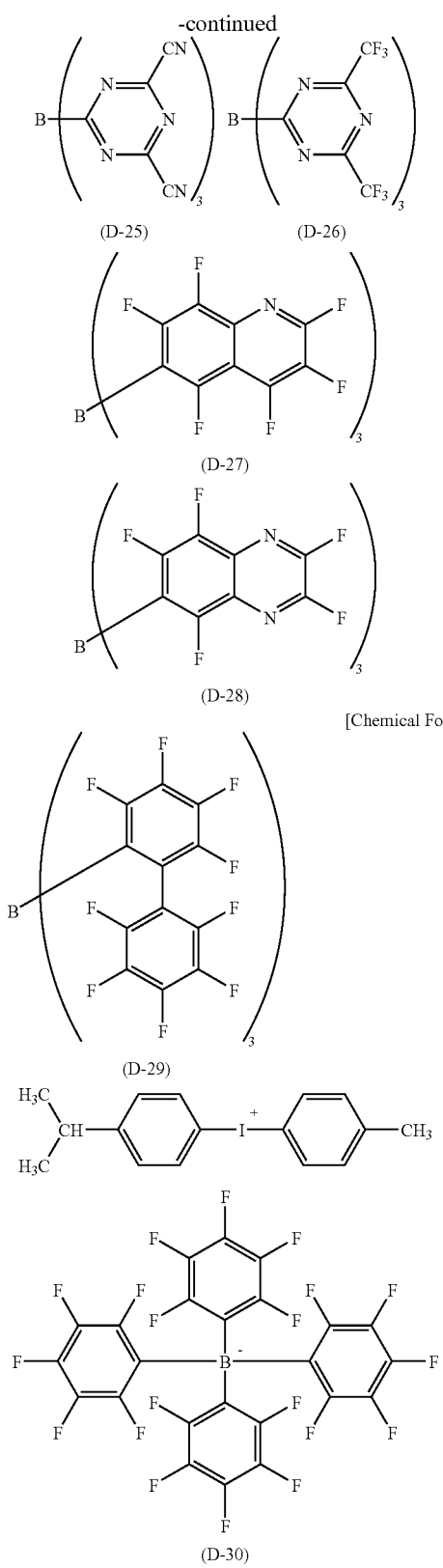

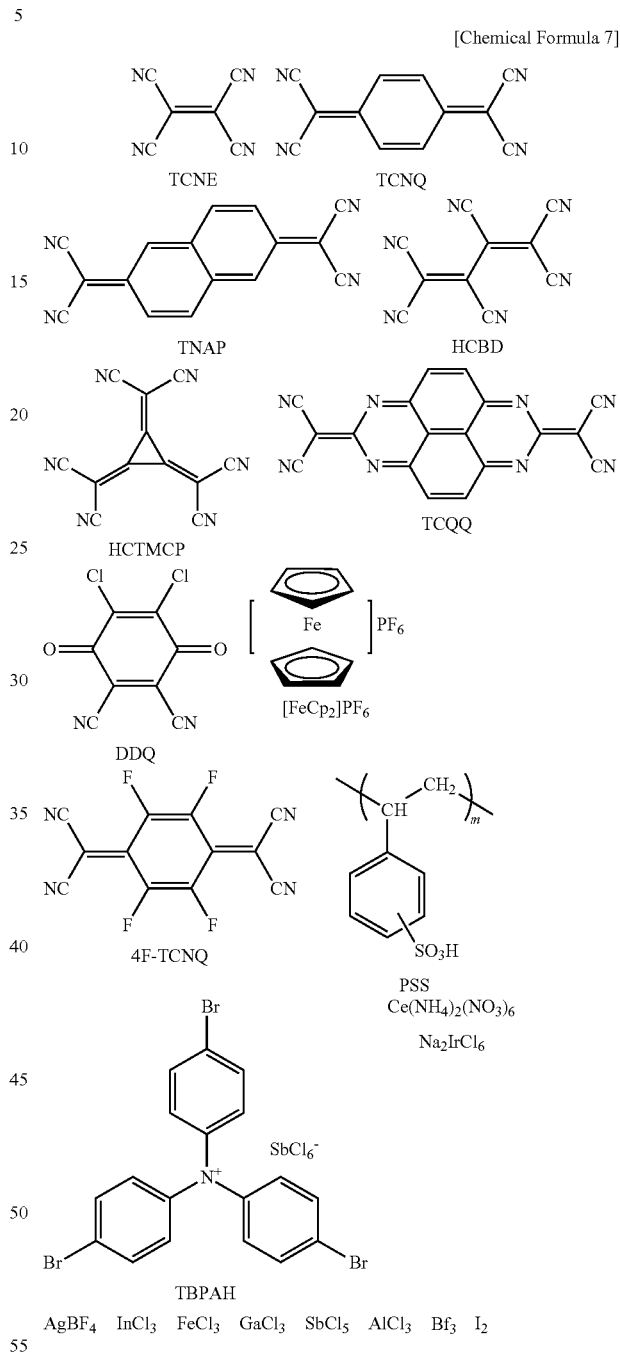

Among these, (D-30) above is particularly preferable.

In addition, specific examples of one or more compounds to be selected as the electron-accepting compound from the group consisting of metal halides, Lewis acids, organic acids, salts formed of aromatic amines and metal halides, and salts formed of aromatic amines and Lewis acids includes the following compounds.

It should be noted that the ratio $W_e/W_p$, where $W_e$ is the weight proportion of the electron-accepting compound relative to the film-forming composition of the present invention and $W_p$ the weight proportion of the hole-injecting/transporting material, is 0.001 or more, and preferably 0.01 or more. At the same time, it is typically 1 or less, and preferably 0.4 or less.

[Moisture Content]

To ensure the evenness of films formed by an inkjet film-forming technique and avoid the deterioration of the organic electroluminescent devices, it is advisable that the moisture content in the film-forming composition of the present invention is low as described above. More specifically, moisture contained in the film-forming composition is preferably 1 wt % or less, more preferably 0.1 wt % or less, and most preferably 0.05 wt % or less.

To make the moisture content in the film-forming composition equal to or less than the abovementioned upper limit, therefore, the solvent, hole-injecting/transporting material and/or electron-accepting compound for preparation of the film-forming composition should be purified or dried for sufficient moisture removal as required, prior to use.

[Other Components]

Besides the abovementioned solvent, hole-injecting/transporting material and/or electron-accepting composition, additives such as a leveling agent or antifoaming agent may be optionally contained in the film-forming composition of the present invention. Binder resin, described later, may also be added.

[Structure of Organic Electroluminescent Device]

Organic electroluminescent devices produced by using the film-forming composition according to the present invention are explained below.

Figure 1B:
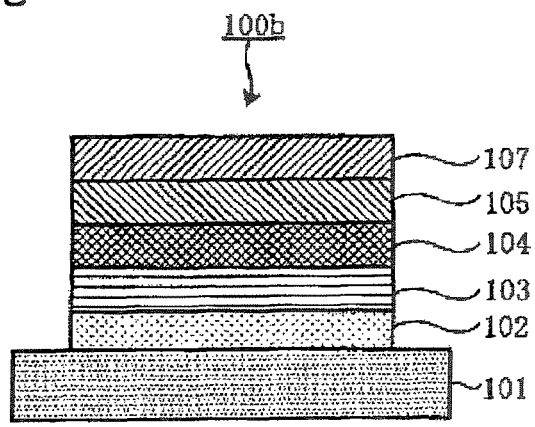
Figure 1C:
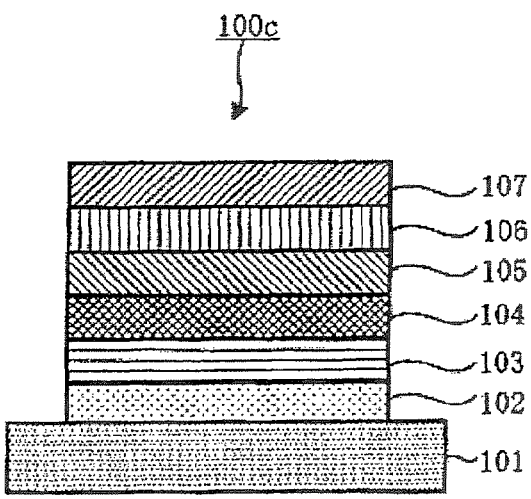

FIGS. 1a to 1c are sectional views that illustrate an example configuration of an organic electroluminescent device with thin layers formed of the film-forming composition according to the present invention.

The organic electroluminescent device 100a shown in FIG. 1a has the substrate 101 as well as the anode 102, the hole-injecting layer 103, the luminescent layer 105 and the cathode 107, each of which is sequentially laminated on the substrate 101.

The substrate 101 is a support for the organic electroluminescent device 100a. Examples of material to form the substrate 101 include quartz plates, glass plates, metal plates, metal foil, plastic films and plastic sheets. In particular, glass plates and transparent plastic sheets made from polyesters, polymetacrylates, polycarbonates and polysulfones are preferable.

The anode 102 is mounted on the substrate 101 to play a role of injecting a hole into the hole-injecting layer 103. Examples of material to form the anode 102 include metals such as aluminum, gold, silver, nickel, palladium and platinum; conductive metal oxides such as indium and/or tin oxides; metal halides such as copper iodide; carbon black; and conductive polymers such as poly(3-methylthiophene), polypyrrole and polyaniline.

Typical examples of methods used to form the anode 102 include spattering and vacuum deposition on the substrate 101; a method wherein fine particles of silver or other metals, fine particles of copper iodide or others, carbon black, fine particles of conductive metal oxides or fine particles of conductive polymers are dispersed in an appropriate binder resin solution followed by application onto the substrate 101; a method wherein a polymerized conductive thin film is directly formed on the substrate 101 via electrolytic polymerization; and a method wherein a conductive polymer solution is applied onto the substrate 101. In general, visible transmittance of the anode 102 is preferably 60% or higher, and more preferably 80% or higher. Thickness of the anode 102 is typically 1000 nm or less, and preferably 500 nm or less, as well as typically 5 nm or more, and preferably 10 nm or more.

The hole-injecting layer to be mounted on the anode 102 is preferably formed by a wet film-forming method using, preferably, the film-forming composition of the present invention. Because organic electroluminescent devices are formed by laminating many layers of organic compounds, it is very important to ensure the film characteristics are uniform. In the layer formation via a wet film-forming method, a certain technique is adopted from application techniques such as spin-coating and spraying, printing techniques such as an inkjet technique and screen technique, and other known film-forming techniques depending on characteristics of the material and substrate. The most suitable technique is the inkjet technique, which enables to form a uniform film on a desired area by fine patterning. The inkjet technique is especially useful to mount an organic layer on a certain area in the substrate surface where unevenness due to the presence of patterned electrodes or walls between imaging elements has been left.

It is preferable that the hole-injecting layer 103 is formed by using a hole-injecting/transporting material and an electron-accepting compound capable of oxidizing this hole-injecting/transporting material. Thickness of the film of the thus-prepared hole-injecting layer 103 is typically 5 nm or more, and preferably 10 nm or more. At the same time, it is typically 1,000 nm or less, and preferably 500 nm or less.

The luminescent layer 105 is mounted on the hole-injecting layer 103, and is formed of material that efficiently recombines electrons injected from the cathode 107 with holes transported from the hole-injecting layer 103 in an impressed electric field and efficiently emits light via the recombination. Examples of material to form the luminescent layer 105 include luminescent materials derived from small molecules such as 8-hydroxyquinoline complexes with aluminum or other metals, 10-hydroxybenzo[h]quinoline complexes with metals, bisstyrylbenzene derivatives, bisstyrylarylene derivatives, (2-hydroxyphenyl)benzothiazole complexes with metals and silole derivatives; and systems where luminescent material and electron-transporting material are blended in a polymeric compound such as poly(p-phenylenevinylene), poly[2-methoxy-5-(2-ethylhexyloxy)-1,4-phenylenevinylene), poly(3-alkylthiophene) and polyvinylcarbazole.

Furthermore, doping naphthacene derivatives such as rubrene, quinacridone derivatives, condensed polycyclic aromatic rings such as perylene, or others to the host material, e.g., metal complexes including 8-hydroxyquinoline complexes with aluminum, so as to account for 0.1 to 10 wt %, can greatly improve the luminescent properties, in particular, driving stability of the device. Such material forms a thin film on the hole-injecting layer 103 by a vacuum deposition method or a wet film-forming method such as an inkjet film-forming technique. Thickness of the film of the thus-prepared luminescent layer 105 is typically 10 nm or more, and preferably 30 nm or more. At the same time, it is typically 200 nm or less, and preferably 100 nm or less.

The cathode 107 plays a role of injecting electrons to the luminescent layer 105. Preferred material of the cathode 107 is metal that exhibits a low work function, including appropriate metals such as tin, magnesium, indium, calcium, aluminum and silver, or their alloy. Specific examples include electrodes of low-work function alloys such as magnesium-silver alloy, magnesium-indium alloy, and aluminum-lithium alloy. In general, thickness of the film of the cathode 107 is same as that of the anode 102.

Laminating an air-resistant metal layer with a high work function on the anode 107 made from a low-work function metal for the purpose of protection is effective to improve stability of the device. To this end, metals such as aluminum, silver, copper, nickel, chrome, gold and platinum are used. Furthermore, insertion of the ultrathin insulating film (film thickness is 0.1 to 5 nm) derived from LiF, $MgF_2$, $Li_2O$ or other compounds into the interface between the cathode 107 and the luminescent layer 105 can increase efficiency of the device.

FIG. 1b is a diagram to illustrate a function-separated luminescent device. In the organic electroluminescent device 100b shown in FIG. 1b, the hole-transporting layer 104 is inserted between the hole-injecting layer 103 and the luminescent layer 105 for improvement of the luminescent properties of the device, and other layers are in the same configuration as that of the organic electroluminescent device 10a shown in FIG. 1a.

Material of the hole-transporting layer 104 requires high efficiency for receiving holes from the hole-injecting layer 103 and a capability to transport the received holes efficiently. Therefore, a low ionization potential, high hole-mobility, excellent stability and low incidence of impurities acting as a trap during manufacturing and use are necessary. In addition, it is advisable that the layer, which directly contacts the luminescent layer 105, does not contain any quenching substances.

Examples of hole-injecting/transporting materials to form the hole-injecting layer 104 are the same as those illustrated for the hole-injecting/transporting material in the film-forming composition of the present invention. Polymeric materials such as polyvinylcarbazole, polyvinyltriphenylamine, and polyarylene ether sulfone containing tetraphenylbenzidine are also involved. The hole-transporting layer 104 is formed by laminating such a hole-injecting/transporting material on the hole-injecting layer 103 by a vacuum deposition method or a wet film-forming method such as an inkjet film-forming technique. Thickness of the film of the thus-prepared hole-transporting layer 104 is typically 10 nm or more, and preferably 30 nm or more. At the same time, it is typically 300 nm or less, and preferably 100 nm or less.

FIG. 1c is a diagram to illustrate the other embodiment of the function-separated luminescent device. In the organic electroluminescent device 100c shown in FIG. 1c the electron-transporting layer 106 is inserted between the luminescent layer 105 and the cathode 107, and other layers are in the same configuration as that of the organic electroluminescent device 100b shown in FIG. 1b.

Compounds used as the electron-transporting layer 106 requires ease of receiving electrons from the cathode 107 and better electron-transporting performance. Examples of such electron-transporting material include 8-hydroxyquinoline complexes with aluminum, oxadiazole derivatives, systems in which these compounds are dispersed in resins such as polymethyl methacrylate (PMMA), phenanthroline derivatives, 2-t-butyl-9,10-N,N'-dicyanoanthraquinone diimine, n-type hydrogenated amorphous carbon silicon, n-type zinc sulfate, n-type zinc selenide. The electron-transporting layer 106 is formed by laminating such electron-transporting material on the luminescent layer 105 by a vacuum deposition method or a wet film-forming method such as an inkjet film-forming technique. Thickness of the film of the thus-prepared electron-transporting layer 106 is typically 5 nm or more, and preferably 10 nm or more. At the same time, it is typically 200 nm or less, and preferably 100 nm or less.

The organic electroluminescent devices according to the present invention are not limited to those illustrated in the figures. For example, the reverse structure of those shown in FIGS. 1a to 1c, i.e., laminating the cathode 107, the luminescent layer 105, the hole-injecting layer 103, and the anode 102 sequentially on the substrate 101, is possible. It is also possible to install the organic electroluminescent device between two substrates at least one of which is highly transparent. Furthermore, the layer containing the hole-injecting/transporting material and the electron-accepting compound does not always have to be the hole-injecting layer 103 that contacts the anode 102. It is permissible to insert such a layer into any interval between the anode 102 and the luminescent layer 105 but the layer is preferably inserted to be the hole-injecting layer 103. Moreover, any desired layers may be inserted between individual layers shown in FIGS. 1a to 1c. Though not shown in the figures, it is also allowed to use wall-like structures of insulating material surrounding imaging elements, so-called "banks," partitions dividing the cathode, nonlinear elements to activate the imaging elements, or others.

[Manufacturing Method of Organic Electroluminescent Devices]

Manufacturing methods of organic electroluminescent devices that contain thin films formed by an inkjet film-forming technique using the film-forming composition according to the present invention are explained below.

For example, in manufacturing of the organic electroluminescent devices 100a to 100c shown in FIGS. 1a to 1c, the anode 102 is formed on the substrate 101 by spattering, vacuum deposition or other methods. At least one of the hole-injecting layer 103 and the hole-transporting layer 104 is formed on the anode 102 by the inkjet film-forming technique using the composition of the present invention. On the hole-injecting layer 103 and/or the hole-transporting layer 104, the luminescent layer 105 is created by a vacuum deposition method or the inkjet film-forming method. If required, the electron-transporting layer 106 is prepared on the luminescent layer 105 by the vacuum deposition or the inkjet film-forming technique. The cathode 107 is mounted on the luminescent layer 105 or the electron-transporting layer 106.

In general, to form at least one of the hole-injecting layer 103 and the hole-transporting layer 104 by the inkjet film-forming technique, optional additives such as binder resin that does not trap holes or an agent to improve coating properties are added and dissolved in the predetermined amount of a hole-injecting/transporting material and/or an electron-accepting compound to form a coating liquid, i.e., the film-forming composition. This composition is applied onto the anode 102 by the inkjet film-forming technique and dried, resulting in the formation of at least one of the hole-injecting layer 103 and the hole-transporting layer 104.

Considering hole mobility, the content of the binder resin in the obtained film is preferably 50 wt % or less and more preferably 30 wt % or less, and most preferably, the film is substantially absent of the binder resin.

Furthermore, in the formation of a layer containing the hole-injecting/transporting material and/or the electron-transporting compound, adding a heating process after the inkjet film-forming and the drying processes can reduce the content of solvent remaining in the obtained film and the content of moisture, which has contaminated the film during the inkjet film-forming or other processes, thus improving device characteristics. More specifically, a layer containing the hole-injecting/transporting material and/or the electron-accepting compound is formed by the inkjet film-forming technique and then, the substrate is heated with a hot plate, an oven or other means. To maximize the effect of the heating process, treatment at 100° C. or higher is advisable. Typical heating time is approximately one minute to eight hours. Thus the layer, which contains the hole-injecting/transporting material and/or the electron-accepting compound and has been formed by the inkjet film-forming technique, has an even surface, solving the problem of a short-circuit during manufacturing of the device caused by surface roughness of the anode 102 such as ITO.

EXAMPLES

This embodiment is explained in more detail with reference to Examples, Comparative Examples and Reference Examples. However, this embodiment is not limited by the following description of Examples.

Physical properties of solvents used in following Examples and Comparative Examples are shown in Table 1 below.

TABLE 1

| Solvent | Boiling point (° C.) | Vapor pressure (torr) A value in parentheses is measurement temperature |
|---|---|---|
| Ethyl benzoate | 213 | 0.27 (25° C.) |
| Anisole | 154 | 3.5 (25° C.) |
| Cyclohexanone | 156 | 5 (26° C.) |
| 2-Phenoxyethyl acetate | 260 | <0.01 (20° C.) |

In addition, the compound (1-3) illustrated above was used as a hole-injecting/transporting material, and the compound (D-30) illustrated above was used as an electron-accepting compound.

Examples 1 to 23

Comparative Examples 1 to 4

Inkjet Application

Preparation of the Film-Forming Compositions

The film-forming compositions were prepared by mixing constituents and solvents according to the formulations shown in Table 2. Hereinafter, the prepared film-forming compositions are simply called "ink."

Evaluation of Spraying Statuses

Spraying of the prepared ink from a spray head nozzle was observed using the inkjet application apparatus equipped with a piezo-driven spray head as follows.

The ink was continuously sprayed from the nozzle for five minutes and the spraying statuses after five minutes were observed. The number of defective nozzles, which could not spray the ink due to nozzle clogging or failed to spray the ink properly due to angled spraying, was counted and evaluated as follows.

VG (Very Good): The ratio of the number of defective nozzles to the total number of nozzles is lower than 10%.

G (Good): The ratio of the number of defective nozzles to the total number of nozzles is 10% or higher, and lower than 50%.

NG (Not Good): The ratio of the number of defective nozzles to the total number of nozzles is 50% or higher.

Evaluation of Application Statuses

Some types of the prepared ink above were chosen and the application test was carried out according to the following procedures.

Figure 2A:
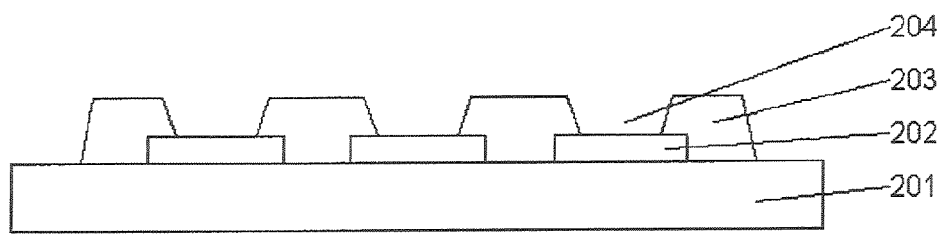
FIGS. 2a and 2b are schematic diagrams of the method used in application tests for the evaluation of application statuses in Example 1 to 23.

1) As shown in FIG. 2a, an ITO film was formed on a glass substrate by spattering so as to have 150 nm of thickness, and then the film was photo-etched into a predetermined pattern to form the anode 202. After that, the bank 203 was created on the substrate 201 by patterning polyimide. The dimension of each imaging element portion 204 surrounded by the banks 203 was 135 μm×85 μm, and the imaging element area was patterned into a matrix that has 54 columns and 32 rows.

Figure 2B:
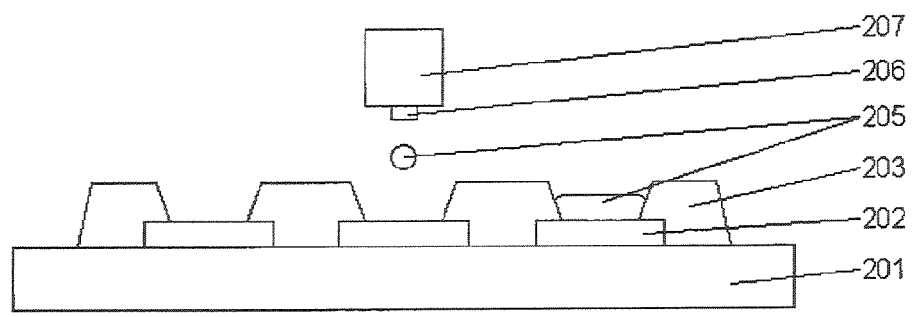

2) As shown in FIG. 2b, the prepared ink 205 was sprayed from the nozzle 206 of the spray head 207 and applied onto the imaging element portions 204 divided by the banks 203 using the same inkjet application apparatus as one used in the evaluation of spraying statuses.

3) The substrate of 2) was heated at 200° C. until the ink was dry to obtain the thin film with approximately 20 nm of film thickness.

4) Statuses of the thin film formed onto the imaging elements on the substrate of 3) were observed using an optical microscope and evaluated according to the following criteria.

VG: A substantially uniform film was formed.

G: Though having slight unevenness, a film spreading over the entire imaging element was formed.

NG: The liquid was aggregated into dots, resulting in insufficient film formation.

Evaluation of Blur Width

In Examples 21 to 23, the thin films formed in the manner described above were evaluated for blur width.

Figure 3:
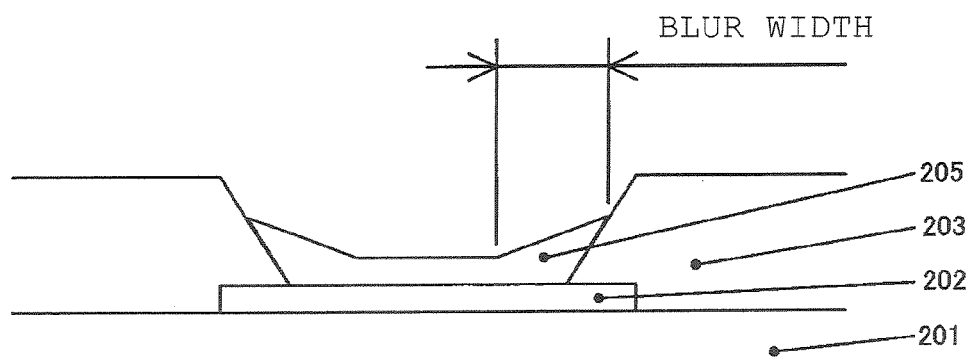
[FIG. 3] A schematic diagram that shows a blur width evaluated in Examples.

Blur width means, as shown in FIG. 3, the width of the region on the edge of the bank 203, where the film thickness of the ink 205 is uneven.

Blur width was determined by observation with an optical microscope.

Evaluation Results

The results of the evaluations described above are shown in Table 2.

Figure 4:
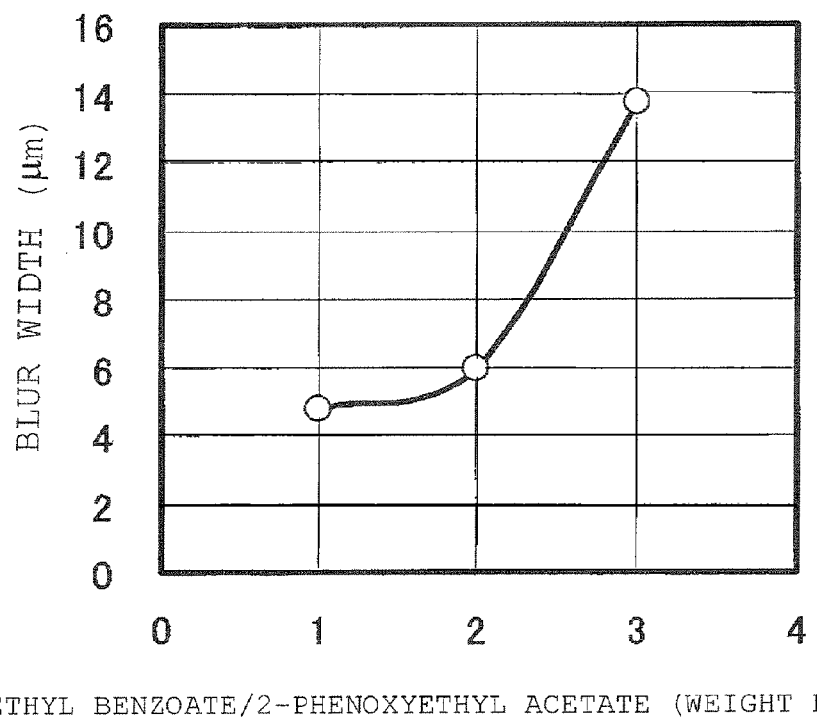
[FIG. 4] A graph that represents the relationship between the solvent composition ratio and the blur width in Examples 21 to 23.

Also, the relationship between the solvent composition ratio and the blur width is shown in FIG. 4.

TABLE 2

| Examples | Composition for organic electroluminescent devices | Amount contained in the composition (wt %) | | Solvent composition (weight ratio) | | | | Spraying status | Application status | Blur width (μm) |
|---|---|---|---|---|---|---|---|---|---|---|
| | | Hole-injecting/transporting material | Electron-accepting compound | Ethyl benzoate | 2-Phenoxyethyl acetate | Anisole | Cyclo-hexanone | | | |
| Examples | | | | | | | | | | |
| 1 | Ink 1 | 2.00 | 0.40 | 1 | — | 5 | — | VG | | |
| 2 | Ink 2 | 2.00 | 0.40 | — | 1 | 4 | — | VG | | |
| 3 | Ink 3 | 2.00 | 0.40 | 1 | — | 1 | — | VG | | |
| 4 | Ink 4 | 2.00 | 0.40 | 1 | — | — | 1 | VG | | |
| 5 | Ink 5 | 2.00 | 0.40 | 1 | — | — | — | VG | G | |
| 6 | Ink 6 | 2.00 | 0.40 | 19 | 1 | — | — | VG | VG | |
| 7 | Ink 7 | 2.00 | 0.40 | 9 | 1 | — | — | VG | VG | |
| 8 | Ink 8 | 2.00 | 0.40 | 4 | 1 | — | — | VG | VG | |
| 9 | Ink 9 | 3.50 | 0.70 | 1 | — | — | — | VG | | |
| 10 | Ink 10 | 4.00 | 0.80 | 9 | 1 | — | — | VG | | |
| 11 | Ink 11 | 4.00 | 0.80 | 4 | 1 | — | — | VG | | |
| 12 | Ink 12 | 5.00 | 1.00 | — | 2 | 9 | 9 | VG | | |
| 13 | Ink 13 | 5.00 | 1.00 | 1 | — | 1 | 1 | VG | | |

TABLE 2-continued

| Examples | Composition for organic electroluminescent devices | Amount contained in the composition (wt %) | | Solvent composition (weight ratio) | | | | Spraying status | Application status | Blur width (μm) |
|---|---|---|---|---|---|---|---|---|---|---|
| | | Hole-injecting/transporting material | Electron-accepting compound | Ethyl benzoate | 2-Phenoxyethyl acetate | Anisole | Cyclohexanone | | | |
| 14 | Ink 14 | 5.00 | 1.00 | 1 | — | — | — | VG | G | |
| 15 | Ink 15 | 5.00 | 1.00 | 9 | 1 | — | — | VG | VG | |
| 16 | Ink 16 | 5.00 | 1.00 | 6 | 1 | — | — | VG | VG | |
| 17 | Ink 17 | 5.00 | 1.00 | 4 | 1 | — | — | VG | VG | |
| 18 | Ink 18 | 5.00 | 1.00 | 4 | 1 | — | — | VG | VG | |
| 19 | Ink 19 | 5.00 | 1.00 | 3.5 | 1 | — | — | VG | | |
| 20 | Ink 20 | 5.00 | 1.00 | 3 | 1 | — | — | VG | VG | |
| 21 | Ink 21 | 5.00 | 1.00 | 3 | 1 | — | — | VG | VG | 13.77 |
| 22 | Ink 22 | 5.00 | 1.00 | 2 | 1 | — | — | VG | VG | 5.99 |
| 23 | Ink 23 | 5.00 | 1.00 | 1 | 1 | — | — | VG | VG | 4.79 |
| Comparative Examples | | | | | | | | | | |
| 1 | Ink 50 | 2.00 | 0.40 | — | — | 1 | — | G | | |
| 2 | Ink 51 | 2.00 | 0.40 | — | — | 1 | 1 | NG | | |
| 3 | Ink 52 | 2.00 | 0.40 | — | — | 4 | 1 | G | | |
| 4 | Ink 53 | 5.00 | 1.00 | — | — | 1 | 1 | NG | | |

Discussion

The evaluation results above suggest the following facts.

Spraying Status

All types of ink in Examples 1 to 23 showed a small number of defective nozzles, proved to be sprayed properly. The reason for this may be the fact that the application liquid was resistant to dryness due to boiling points of at least 200° C. and vapor pressures of 1 torr or lower at room temperature of ethyl benzoate and 2-phenoxyethyl acetate, thus being unlikely to clog the nozzle.

In particular, the ink containing a larger content of 2-phenoxyethyl acetate, which had a higher boiling point and a lower vapor pressure, was excellent in terms of the spraying status.

On the other hand, in Comparative Examples 1 to 4 wherein the solvent consisted of only liquids with boiling points lower than 200° C. or vapor pressures higher than 1 torr at 25° C., such as anisole and cyclohexanone, the nozzle was likely to get defective.

Application Status

The ink using single solvent, ethyl benzoate, in Examples 5 and 14 as well as the ink using mixed solvents of ethyl benzoate and 2-phenoxyethyl acetate in Examples 6 to 8, 14 to 18 and 20 to 23 provided favorable films. The reason for this may be the fact that the application liquid was resistant to dryness due to boiling points of at least 200° C. and vapor pressures of 1 torr or lower at room temperature of ethyl benzoate and 2-phenoxyethyl acetate, so that the coating liquid spread onto the imaging elements easily and had a good leveling property.

In particular, the coating liquid containing mixed solvent of ethyl benzoate and 2-phenoxyethyl acetate provided a uniform film with little unevenness. This may be attributed to resistance to dryness and an excellent leveling property of the ink due to a very high boiling point of 2-phenoxyethyl acetate.

Blur Width

Blur widths in Examples 21 to 23 were 20 μm or less, and thus all types of ink achieved a favorable application status. In particular, Example 22 and Example 23, in which the content of 2-phenoxyethyl acetate was higher when compared with the weight ratio of ethyl benzoate/2-phenoxyethyl acetate=3/1, the blur widths were significantly small and excellent application statuses were attained. This may be attributed to resistance to dryness and an excellent leveling property of the ink due to a very high boiling point of 2-phenoxyethyl acetate. As a result, it was found that films excellent especially in evenness can be obtained in a range of solvent compositions where the content of 2-phenoxyethyl acetate is higher when compared with the weight ratio of ethyl benzoate/2-phenoxyethyl acetate=3/1

Examples 24 to 28

Spraying Application

Preparation of the Film-Forming Compositions

In the same manner as Examples 1 to 23, the film-forming compositions (ink) were prepared by mixing constituents and solvents according to the formulations shown in Table 3.

Evaluation of Mist Statuses

Using the spraying apparatus NVD200, manufactured by Fujimori Technical Laboratory Inc., the prepared ink was observed for its mist sprayed from the nozzle, as follows.

After one-minute spraying of the ink from the nozzle, the nozzle was let stand for 30 minutes without spraying. Then the ink was sprayed once again, and the mist was observed and evaluated immediately after the re-spraying as follows. It should be noted the state of "proper mist" represents the case in which the shape of mist sprayed from the nozzle is completely conical. The clogged nozzle causes the shape of mist to be irregular, resulting in out-of-conical mist in many cases.

G: Proper mist was observed from the beginning of re-spraying.

NG: Clogging occurred.

Evaluation of Application Statuses

Figure 5:
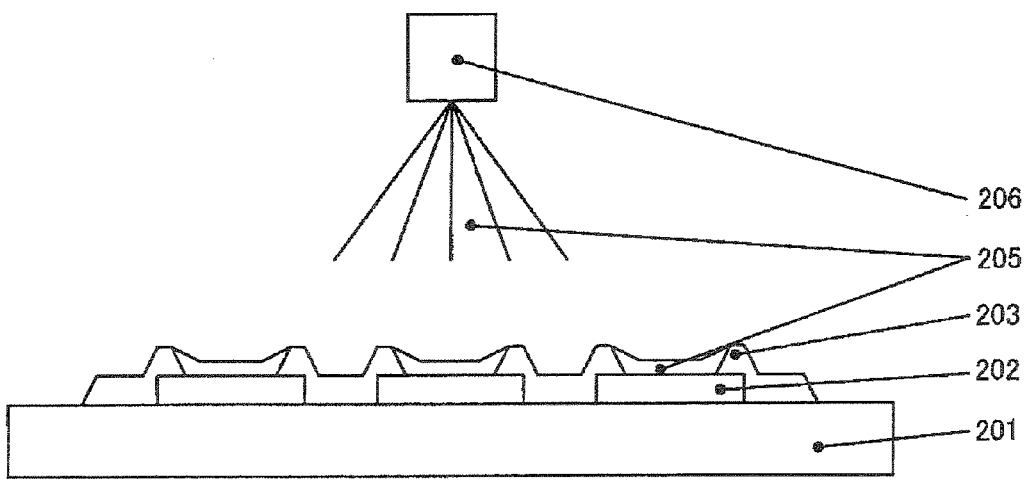
[FIG. 5] A schematic diagram of the method used in application tests for the evaluation of application statuses in Examples 24 to 28.

Using the spraying apparatus NVD200, manufactured by Fujimori Technical Laboratory Inc., the ink prepared as described above was sprayed from the nozzle 206 of the spraying apparatus and applied onto the whole surface of the substrate 201, on which the anode 202 and the banks 203 had been formed in the same manner as Examples 1 to 23, as shown in FIG. 5. In this spraying apparatus, the ink and high-pressure nitrogen gas are supplied into the nozzle 206, and then the ink is atomized by the nitrogen gas and sprayed from the nozzle. The substrate, onto which the ink had been applied in such a way, was heated at 200° C. until the ink was dry to obtain the thin film with approximately 130 nm of film thickness.

The substrates on which the thin film was formed in this way were evaluated for the application status in the same manner as Examples 1 to 23.

Evaluation of Blur Width

The thin films formed in the manner described above were evaluated for blur width as well as Examples 21 to 23.

Evaluation Results

The results of the evaluations described above are shown in Table 3.

Figure 6:
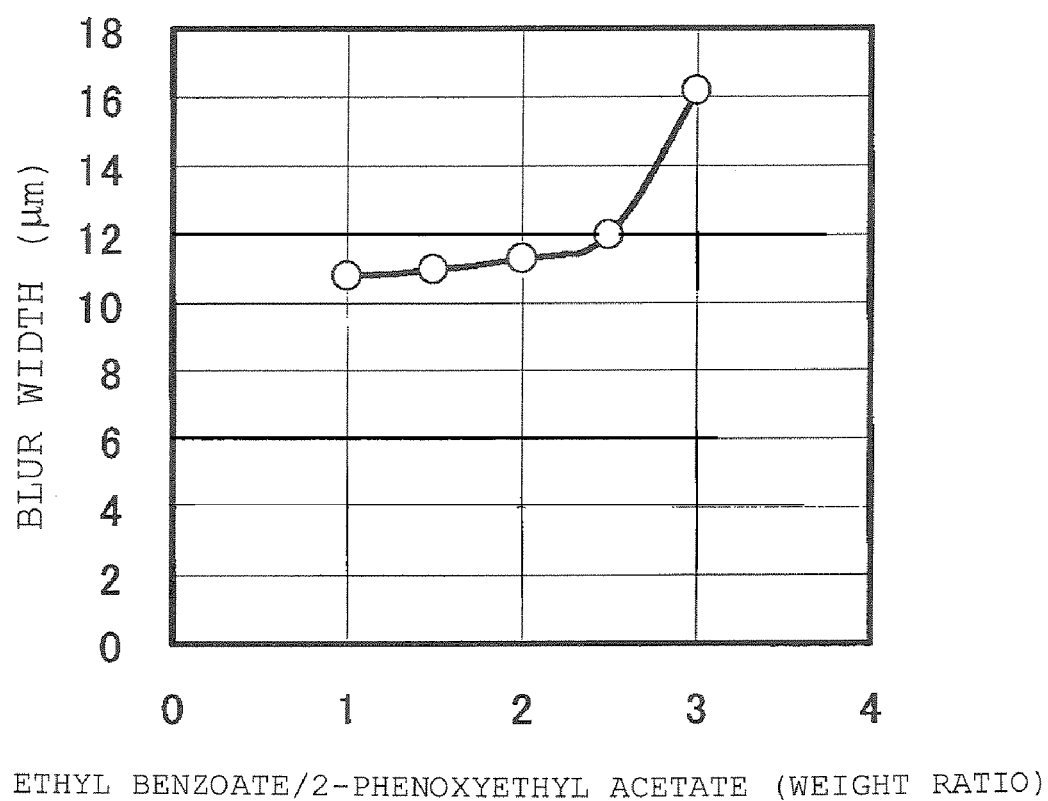
[FIG. 6] A graph that represents the relationship between the solvent composition ratio and the blur width in Examples 24 to 28.

Also, the relationship between the solvent composition ratio and the blur width is shown in FIG. 6.

TABLE 3

| Examples | Composition for organic electroluminescent devices | Amount contained in the composition (wt %) | | Solvent composition (weight ratio) | | Spraying status | Application status | Blur width (μm) |
|---|---|---|---|---|---|---|---|---|
| | | Hole-injecting/transporting material | Electron accepting compound | Ethyl benzoate | 2-Phenoxyethyl acetate | | | |
| Example 24 | Ink 24 | 3.00 | 0.60 | 3 | 1 | G | VG | 16.17 |
| Example 25 | Ink 25 | 3.00 | 0.60 | 2.5 | 1 | G | VG | 11.98 |
| Example 26 | Ink 26 | 3.00 | 0.60 | 2 | 1 | G | VG | 11.31 |
| Example 27 | Ink 27 | 3.00 | 0.60 | 1.5 | 1 | G | VG | 10.99 |
| Example 28 | Ink 28 | 3.00 | 0.60 | 1 | 1 | G | VG | 10.78 |

Discussion

The evaluation results above suggest the following facts.

Mist Status

All types of ink in Examples 24 to 28 showed no clogging in the nozzle, proved to be sprayed properly. The reason for this may be the fact that the ink was resistant to dryness due to boiling points of at least 200° C. and vapor pressures of 1 torr or lower at room temperature of ethyl benzoate and 2-phenoxyethyl acetate, thus being unlikely to clog the nozzle. In particular, the larger content of 2-phenoxyethyl acetate, which had a higher boiling point and a lower vapor pressure, was considered to contribute to the excellent mist statuses.

Application Status

All types of ink in Example 24 to 28 provided favorable films. The reason for this may be the fact that the application liquid was resistant to dryness due to boiling points of at least 200° C. and vapor pressures of 1 torr or lower at room temperature of ethyl benzoate and 2-phenoxyethyl acetate, so that the ink spread onto the imaging elements easily and acquired a good leveling property.

Blur Width

Blur widths in Examples 24 to 28 were 20 μm or less, and thus all types of ink achieved a favorable application status. In particular, Examples 25 to 28, in which the content of 2-phenoxyethyl acetate is higher when compared with the weight ratio of ethyl benzoate/2-phenoxyethyl acetate=3/1, the blur widths were significantly small and excellent application statuses were attained. This may be attributed to resistance to dryness and an excellent leveling property of the ink due to a very high boiling point of 2-phenoxyethyl acetate. As a result, it was found that films excellent especially in evenness can be obtained in a range of solvent compositions where the content of 2-phenoxyethyl acetate is higher when compared with the weight ratio of ethyl benzoate/2-phenoxyethyl acetate=3/1.

These results revealed that the ink according to the present invention is suitable not only for an inkjet technique but also for splaying application.

In Examples above, it was confirmed that the ink according to the present invention has "resistance to dryness," "a good leveling property," and other excellent properties, thus being appropriate for an inkjet method and a spraying method. Furthermore, it was ascertained that films excellent especially in evenness can be obtained in a range of solvent compositions where the content of 2-phenoxyethyl acetate is higher when compared with the weight ratio of ethyl benzoate/2-phenoxyethyl acetate=3/1.

The excellent properties of the ink according to the present invention, such as "resistance to dryness" and "a good leveling property," are effective also for application methods other than the inkjet and the spraying methods, e.g., printing methods such as flexographic printing, an application technique in which the ink is supplied from a slit-like nozzle such as blade coating, or spin coating.

Though the present invention was described in detail with reference to the specific mode, the possibility of a wide variety of modifications without deviation from the intent and the scope of the invention will be clearly understood by those skilled in the art.

In addition, this application is based on the Japanese Patent Application filed on Feb. 15, 2005 (Japanese Patent Application No. 2005-037902), and its full text is cited by quotation.

The invention claimed is:

1. A film-forming composition, which is a composition used to form a film of a hole-injecting/transporting layer of an organic electroluminescent device, wherein the film-forming composition contains a hole-injecting/transporting material and/or an electron-accepting compound and a liquid in which the material and/or the compound have been dissolved;

the liquid contains two or more different first solvents having either a boiling point of at least 200° C. or a vapor pressure of 1 torr at 25° C. or lower, a molecule of said first solvents having one selected from the group consisting of an aromatic ring and an oxygen atom; an aliphatic ring and an oxygen atom; and an aromatic ring, and aliphatic ring and an oxygen atom;

wherein one first solvent has a higher evaporability than another first solvent which has a lower evaporability and either a higher boiling point or a lower vapor pressure at 25° C.; and a ratio $W_a/W_b$ of 1 to 2.5 where $W_a$ is the weight proportion of the first solvent having a higher evaporability and $W_b$ is the weight proportion of the first solvent having a lower evaporability; and the amount of the first solvent contained in the composition is 3 wt % or more.

2. The film-forming composition according to claim 1, wherein the liquid consists essentially of the first solvents only.

3. The film-forming composition according to claim 1, wherein the liquid contains the first solvents and a second solvent which is not classified into the same type as the first solvents, a molecule of said second solvent having one selected from the group consisting of an aromatic ring and an oxygen atom; an aliphatic ring and an oxygen atom; and an aromatic ring, an aliphatic ring and an oxygen atom; and a ratio $W_2/W_1$, where $W_2$ is the weight proportion of the second solvent and $W_1$ is the weight proportion of the first solvent, is 1 to 20.

4. The film-forming composition according to claim 3, wherein the ratio $W_2/W_1$ is 1 to 2.5.

5. The film-forming composition according to claim 1, wherein the first solvents are aromatic esters.

6. The film-forming composition according to claim 1, wherein the first solvents comprise a benzoate.

7. The film-forming composition according to claim 1, wherein the first solvents comprise ethyl benzoate.

8. The film-forming composition according to claim 1, wherein the one first solvent having a higher evaporability is a benzoate, and the other first solvent having a lower evaporability is an acetate having an aromatic ring.

9. The film-forming composition according to claim 8, wherein the benzoate is ethyl benzoate, and the acetate having an aromatic ring is 2-phenoxyethyl acetate.

10. The film-forming composition according to claim 1, wherein the hole-injecting/transporting material is an aromatic amine compound, and the electron-accepting compound is an aromatic boron compound and/or its salt.

11. The film-forming composition according to claim 1, wherein moisture contained in the composition is 1 wt % or less.

12. The film-forming composition according to claim 1, comprising a hole-injecting/transporting material which is a polymeric compound having intramolecular hole-transporting sites.

13. The film-forming composition according to claim 12, wherein the polymeric compound is polymeric aromatic amine containing tertiary aromatic amino groups as a constitutional unit of its backbone.

14. The film-forming composition according to claim 13, wherein the polymeric compound has the structure shown in Formula (I) as a constitutional unit:

[Chemical Formula 8]

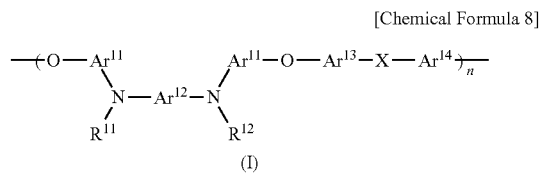

(I)

wherein the groups $Ar^{11}$ to $Ar^{14}$ represent divalent aromatic ring groups, each of which may have a substituent independently chosen, the groups $R^{11}$ and $R^{12}$ represent monovalent aromatic ring groups, each of which may have a substituent independently chosen, and X represents a direct bond or a binding group selected from the following groups:

wherein the aromatic ring groups include both groups derived from aromatic hydrocarbon ring and groups derived from aromatic heterocyclic groups.

[Chemical Formula 9]

15. The film-forming composition according to claim 14, wherein the structure shown in Formula (I) is one of (I-1), (I-2), (I-3) and (I-4) below

[Chemical Formula 10]

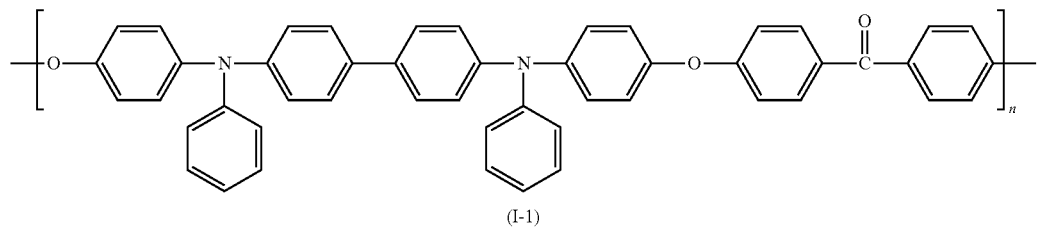

(I-1)

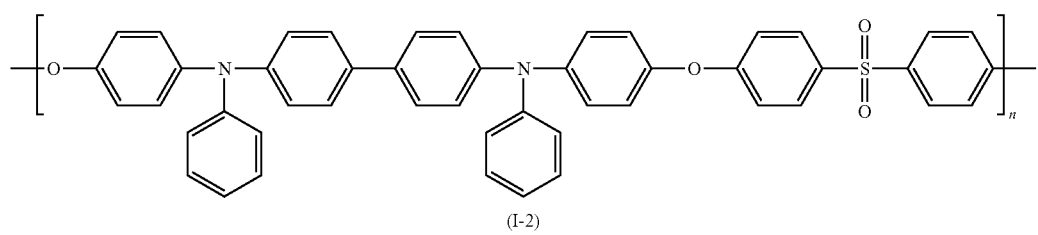

(I-2)

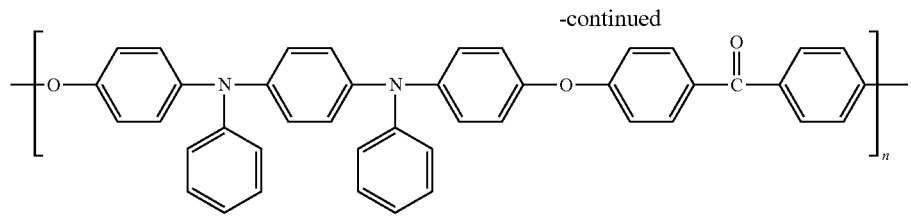

(I-3)

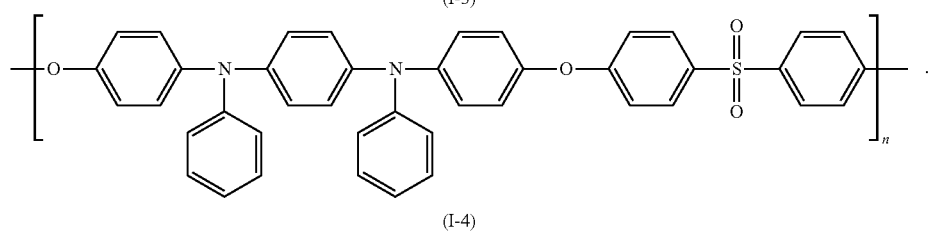

(I-4)

16. The film-forming composition according to claim 15, wherein the structure shown in Formula (I) is (I-3).

17. The film-forming composition according to claim 1, wherein the amount of the hole-injecting/transporting material contained in the film-forming composition is 0.05 to 50 wt %.

18. The film-forming composition according to claim 10, wherein the aromatic boron compound and/or its salt is of formula (D-30) below 21. The film-forming composition according to claim 3, wherein the second solvent is at least one of anisole and cyclohexanone.

22. An organic electroluminescent device, which is an organic electroluminescent device having a hole-injecting/transporting layer, wherein the hole-injecting/transporting layer is formed of the film-forming composition according to claim 1.

[Chemical Formula 11]

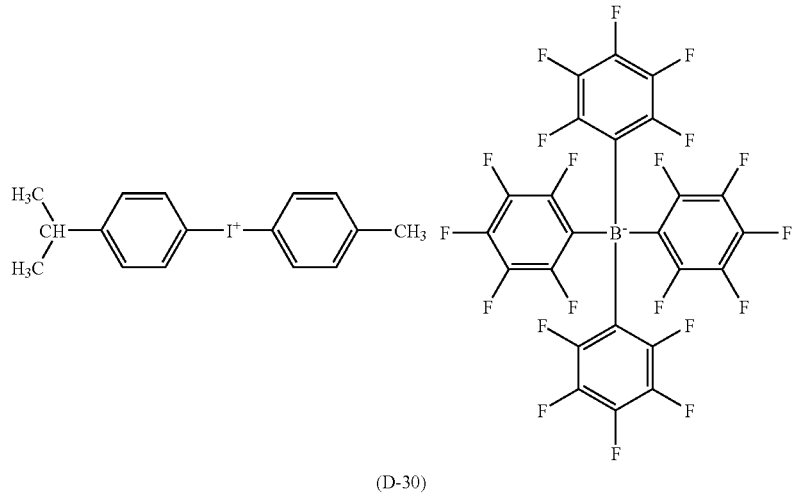

(D-30)

19. The film-forming composition according to claim 1, wherein a ratio $W_e/W_p$, where $W_e$ is the weight proportion of the electron-accepting compound relative to the film-forming composition and $W_p$ is the weight proportion of the hole-injecting/transporting material relative to the film-forming composition, is 0.001 to 1.

20. The film-forming composition according to claim 3, wherein the second solvent is at least one of
aromatic ester having a boiling point less than 200° C. and a vapor pressure higher than 1 torr at 25° C.;
aromatic ether;
alicyclic ketone; and
alicyclic alcohol.

23. The film-forming composition according to claim 1, wherein the liquid consists of a first aromatic ester and a second aromatic ester.

24. The film-forming composition according to claim 1, wherein the liquid consists of ethylbenzoate and 2-phenoxyethyl acetate.

25. The film-forming composition according to claim 1, wherein the ratio $W_a/W_b$ is 1 to 2.

26. The film-forming composition according to claim 1, which does not contain either anisole or cyclohexanone.

* * * * *